United States Patent
Nelaturi et al.

(10) Patent No.: US 11,163,293 B2
(45) Date of Patent: *Nov. 2, 2021

(54) SYSTEM AND METHOD FOR FIXTURE CONFIGURATION DETERMINATION FOR PART MANUFACTURING WITH THE AID OF A DIGITAL COMPUTER

(71) Applicant: SANDVIK INTELLECTUAL PROPERTY AB, Sandviken (SE)

(72) Inventors: Saigopal Nelaturi, Palo Alto, CA (US); Arvind Rangarajan, Santa Clara, CA (US); Tolga Kurtoglu, Freemont, CA (US); Christian Fritz, Menlo Park, CA (US)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 466 days.

This patent is subject to a terminal disclaimer.

(21) Appl. No.: 16/259,926

(22) Filed: Jan. 28, 2019

(65) Prior Publication Data

US 2019/0155251 A1  May 23, 2019

Related U.S. Application Data

(63) Continuation of application No. 14/993,004, filed on Jan. 11, 2016, now Pat. No. 10,191,474, which is a
(Continued)

(51) Int. Cl.
*G06F 17/10* (2006.01)
*G05B 19/4097* (2006.01)
*G06F 30/00* (2020.01)

(52) U.S. Cl.
CPC ......... *G05B 19/4097* (2013.01); *G06F 30/00* (2020.01); *G05B 2219/35025* (2013.01);
(Continued)

(58) Field of Classification Search
CPC ...... G05B 19/4097; G05B 2219/35025; G05B 2219/35043; G05B 2219/35134;
(Continued)

(56) References Cited

U.S. PATENT DOCUMENTS 5,220,718 A * 6/1993 Speller, Sr. ...... G05B 19/41825
29/431
5,333,273 A 7/1994 Raasch et al.
(Continued)

OTHER PUBLICATIONS

D. Vukelic et al., "A Rule-Based System for Fixture Design," Sci. Research and Essays, vol. 6(27), pp. 5787-5802 (2011).
(Continued)

*Primary Examiner* — Andre Pierre Louis
(74) *Attorney, Agent, or Firm* — Leonid Kisselev

(57) ABSTRACT

Automated fixture layout is approached in two distinct stages. First, the spatial locations of clamping points on the work piece are determined to ensure immobility of the fixtured part under any infinitesimal perturbation. Second, spatial locations are matched against a user-specified library of reconfigurable clamps to synthesize a valid fixture layout or configuration that includes clamps that are accessible and collision free. The spatial locations matching during the second stage can be the same spatial locations chosen in the first stage to ensure immobility, or a different set of spatial locations.

20 Claims, 10 Drawing Sheets

Related U.S. Application Data continuation of application No. 13/843,025, filed on Mar. 15, 2013, now Pat. No. 9,235,658.

(52) U.S. Cl.
CPC .............. G05B 2219/35043 (2013.01); G05B 2219/35134 (2013.01); G05B 2219/35218 (2013.01); G05B 2219/36315 (2013.01); G05B 2219/49123 (2013.01); G05B 2219/50125 (2013.01)

(58) Field of Classification Search
CPC ........... G05B 2219/35218; G05B 2219/36315; G05B 2219/49123; G05B 2219/50125; G06F 30/00
USPC .......................................................... 703/1
See application file for complete search history.

(56) References Cited

U.S. PATENT DOCUMENTS

| | | | |
|---|---|---|---|
| 5,351,196 | A | 9/1994 | Sowar et al. |
| 5,546,314 | A | 8/1996 | Brost et al. |
| 5,856,924 | A | 1/1999 | Brost et al. |
| 8,253,730 | B1 | 8/2012 | Carr |
| 8,978,480 | B2 | 3/2015 | Michopoulos |
| 2001/0018312 | A1* | 8/2001 | Gottschalk ......... G05B 19/4099 451/5 |
| 2006/0155402 | A1 | 7/2006 | Read |
| 2008/0091394 | A1* | 4/2008 | Hahn ................. G05B 19/4069 703/7 |
| 2008/0134589 | A1 | 6/2008 | Abrams |
| 2011/0066406 | A1 | 3/2011 | Tsai et al. |

OTHER PUBLICATIONS

X. Kang et al., "Recent Research on Computer-Aided Fixture Planning," Recent Patents on Mechanical Engr., vol. 2, pp. 8-18 (2009).
C.B. Barber et al., "Qhull," (1995) (/www. geom. umn. edu/software/qhull), operated by the University of Minnesota, Minnesota, MN University of Minnesota.
B. Naylor et al., "Merging BSP Trees Yields Polyhedral Set Operations," ACM SIGGRAPH Comp. Graphics, vol. 24 (4), pp. 115-124 (1990).
ZM Bi and WJ Zhang, "Flexible Fixture Design and Automation: Review, Issues and Future Directions." International Journal of Production Research, 39(13):2867-2894, 2001.
A. Bicchi and V. Kumar, "Robotic Grasping and Contact: A review." In Robotics and Automation, 2000. Proceedings. ICRA'00. IEEE International Conference on, vol. 1, pp. 348-353. IEEE, 2000.
R. C. Brost et al., "A CAD Tool That Automatically Designs fixtures and Pallets." Presented at AUTOFACT'95, Chicago IL, Nov. 1995.
D. Ding et al., Computation of Fingertip Positions for a Form-Closure Grasp. Proceedings of the 2001 IEEE International Conference on Robotics & Automation, pp. 2217-2222., Seoul, Korea, May 21, 2004.
B. Mishra et al., "On the Existence and Synthesis of Multifinger Positive Grips." Algorithmica, 2(1):541-558, 1987.
V.D. Nguyen, "Constructing Force-Closure Grasps." The International Journal of Robotics Research, 7(3):3-16, 1988.
E. Rimon et al., "On Force and Form Closure for Multiple Finger Grasps." In Robotics and Automation, 1996. Proceedings., 1996 IEEE International Conference on, vol. 2, pp. 1795-1800. IEEE, 1996.
J. C. Trappey et al., A Literature Survey of Fixture Design Automation. The International Journal of Advanced Manufacturing Technology, 5(3):240-255, 1990.
J.C. Trinkle, A Quantitative Test for Form Closure Grasps. In Intelligent Robots and Systems, 1992., Proceedings of the 1992 IEEE/RSJ International Conference on, vol. 3, pp. 1670-1677, Jul. 1992.
A. S. Wallack et al., "Planning for Modular and Hybrid Fixtures." Algorithmica, 19(1):40-60, 1997.
M. Y. Wang, "An Optimum Design for 3-D Fixture Synthesis in a Point Set Domain." Robotics and Automation, IEEE Transactions on, 16(6):839-846, 2000.
C. Wentink et al., "Algorithms for fixture design." Citeseer, 1996.
Y. Zheng et al., "A Fast N-Dimensional Ray-Shooting Algorithm for Grasping Force Optimization." In Robotics and Automation (ICRA), 2010 IEEE International Conference on, pp. 1300-1305. IEEE, 2010.
Y. Zheng et al., "Efficient Simplex Computation for Fixture Layout Design." Computer-Aided Design, 43 (10)1307-1318, 2011.
Carr Lane Modular Fixturing manual, www.carrlane.com (Web page cached on Aug. 14, 2013).
T. S. Kow et al., "An Integrated Approach to Collision-Free Computer-Aided Modular Fixture Design" The International Journal of Advanced Manufacturing Technology. 2000, pp. 233-244.
Kyoung Hung Kim, A System for Automated Fixture Planning with Modular Fixtures, May 1993, The Robotics Institute Carnegie Mellon University Pittsburgh, Pennsylvania 15213, CMU-RI-TR-93-27.

* cited by examiner

SYSTEM AND METHOD FOR FIXTURE CONFIGURATION DETERMINATION FOR PART MANUFACTURING WITH THE AID OF A DIGITAL COMPUTER

CROSS-REFERENCE TO RELATED APPLICATION

This patent application is a continuation of U.S. patent Ser. No. 14/993,004, filed Jan. 11, 2016, pending, which is a continuation of U.S. Pat. No. 9,235,658, issued Jan. 12, 2016, the priority filing dates of which are claimed, and the disclosures of which are incorporated by reference.

FIELD

This application relates in general to manufacturing parts layout and fixturing, and in particular, to a system for fixture configuration determination for part manufacturing with the aid of a digital computer.

BACKGROUND

The machining of a part from raw stock or material, such as metal, is a form of subtractive manufacturing during which the raw material is progressively removed until the part reaches an intended shape and size. Operations during machining primarily involve turning, drilling and milling the raw material into the desired part, which respectively require removing the raw material by rotating the raw material against a stationary cutting tool, axially boring holes using a rotating bit with a cutting edge on a distal end whilst the raw material is held stationary, and cutting away the raw material using a rotating bit with cutting edges generally along the rotating bit's sides and distal end. Both drilling and milling involve traversing a rotating bit along a longitudinal axis in the Z-direction. Milling, which operates in three-dimensional space, also involves moving the rotating bit along a plane in X- and Y-directions. Other kinds of machining operations and tools also exist. The machining will generally reduce the raw material into rough form within a specified tolerance; further manufacturing processes may be required to smooth, polish, finish, or otherwise transform the part into final form; to check the, such as through inspection or testing; or to assemble a final product.

During manufacture, a part must be immovably mounted using fixtures in suitable configurations that both ensure placement of the part in a known and expected orientation and enable meeting specified manufacturing tolerances. A fixture is a work-holding device that is used to locate and clamp a part's surface to support manufacturing operations, such as machining, inspection and assembly. Typical parts manufacturing requires planning several different fixture layouts or configurations to effectively immobilize the part under manufacture while operated on in various orientations throughout a sequence of manufacturing steps.

The emergence of flexible manufacturing systems has necessitated the design and use of fixtures that have in-built flexibility to rapidly respond to part design changes. These fixtures, known as modular fixtures, represent the most widely-used class of flexible fixtures and are adaptable to a large class of parts. While the design and fabrication of fixtures may reach 20% of the total manufacturing cost, the use of flexible or reconfigurable fixtures can reduce fixture costs by as much as 80%. Modular fixtures are often used for moderate or small manufacturing lot sizes, especially when the cost of dedicated fixtures and the time required to produce the fixtures may be difficult to justify.

Complex work pieces can be located during manufacturing using modular fixtures produced quickly from standard components, and the modular fixtures can later be disassembled for reuse in other parts manufacturing. FIG. 1 is a diagram showing, by way of example, a prior art set of components of a modular fixture 10. Modular fixtures are typically supported on base plates 14 with grid holes or attachment points 15 upon which fixture elements 11, which can include clamps, risers or other components, possibly in combination, are constructed. A fixture element 11 may have a face 12 which will be in contact with a contact location on the part and a mounting feature 12 in contact with an attachment point 15 on the base plate 14. Other fixture element features are possible. Often, details specific to an individual component used in assembling a modular fixture is specialized to a particular purpose and can be unique for each type of component. Increasingly, manufacturers of modular fixture components have listed available components in libraries or catalogs to facilitate manufacturability analysis. For instance, fixture catalogs available online, such as Fixtureworks (www.fixtureworks.net), operated by Fixtureworks, LLC, Fraser, Mich., and Carr Lane (www.carrlane.com), operated by Carr Lane Manufacturing Co., St. Louis, Mo., have devised fixture ontologies for efficiently searching through modular fixture component details in a user-driven query and filter format. In addition, D. Vukelic et al., "A Rule-Based System for Fixture Design," Sci. Research and Essays, Vol. 6(27), pp. 5787-5802 (2011), the disclosure of which is incorporated by reference, describes a representation for fixture catalogs that applies case-based reasoning methods to fixture planning, and is designed to be compatible with generic geometric reasoning-based algorithms for fixture selection and shop-specific reasoning.

Notwithstanding such searchable component libraries, key challenges remain. One challenge is in determining where on a part under manufacture to contact clamps, such that contact locations are both reachable by the clamps throughout the machining process, yet situated so as to not cause the clamps to interfere with the access paths of tools operating on or around the part. A related challenge is in synthesizing configurations of fixtures that may be used to effectively clamp a specific work piece in place without the clamps overlapping with each other, as well as ideally minimizing the types of clamps needed and the swapping out of different clamp types during a sequence of manufacturing steps.

Fixture configuration and planning continues to be an experience-driven and primarily manual activity, and automated solutions to fixture synthesis do not scale well in accommodating variations in work piece geometry. Fixture configuration and planning focuses on determining precise location and clamping of work pieces according to a part's design and process requirements. Process constraints non-exclusively include collision avoidance with surrounding tooling and expected tool paths, accessibility analysis, deformation considerations, material properties, available fixture elements, and manufacturing tolerances. Conventional approaches for computer-assisted fixture planning, such as described in X. Kang et al., "Recent Research on Computer-Aided Fixture Planning," Recent Patents on Mechanical Engr., Vol. 2, pp. 8-18 (2009); and K. Lakshminarayana, Mechanics of Form Closure, Springer-Verlag (1978), the disclosures of which are incorporated by reference, address other types of process constraints, and fail to adequately remedy the problem of contact location selection and manufacturing parts fixturing with components from a vendor-supplied catalog.

Therefore, a need remains for an approach to rapidly synthesizing a realistic fixture configuration, including spatial location of clamps or other fixture elements in contact with a work part that will substantially guarantee stability and immobility of a specified work part.

A further need remains for an approach to matching suitable fixtures selected from a fixture components library that ensures effective fixturing and preferably facilitates efficient performance of sequence steps during execution of manufacturing processes.

SUMMARY

Automated fixture layout is approached in two distinct stages. First, the spatial locations of clamping points on the work piece are determined to ensure immobility of the fixtured part under any infinitesimal perturbation. Second, spatial locations are matched against a user-specified library of reconfigurable clamps to synthesize a valid fixture layout or configuration that includes clamps that are accessible and collision free. The spatial locations matching during the second stage can be the same spatial locations chosen in the first stage to ensure immobility, or a different set of spatial locations.

One embodiment provides a system and method for fixture configuration determination for part manufacturing with the aid of a digital computer. A model of a part to be manufactured and a constraint volume are maintained in a database. A catalog of multiplicity of fixture elements specific to a manufacturing facility and configurable to fixture the part is maintained in the database. Fixturable regions including locations on the part's surfaces that cannot be approached by either a tool in motion used during manufacturing of the part or a clamp are identified by a computer, the computer comprising a processor and coupled to the database. Fixturing points for immobilization of the part are identified by the computer by computing form closure over the fixturable regions. The fixturing points and the constraint volume are used by the computer to select a plurality of the fixture elements for a fixture configuration that ensures stability of the part.

Still other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

DETAILED DESCRIPTION

Figure 1:
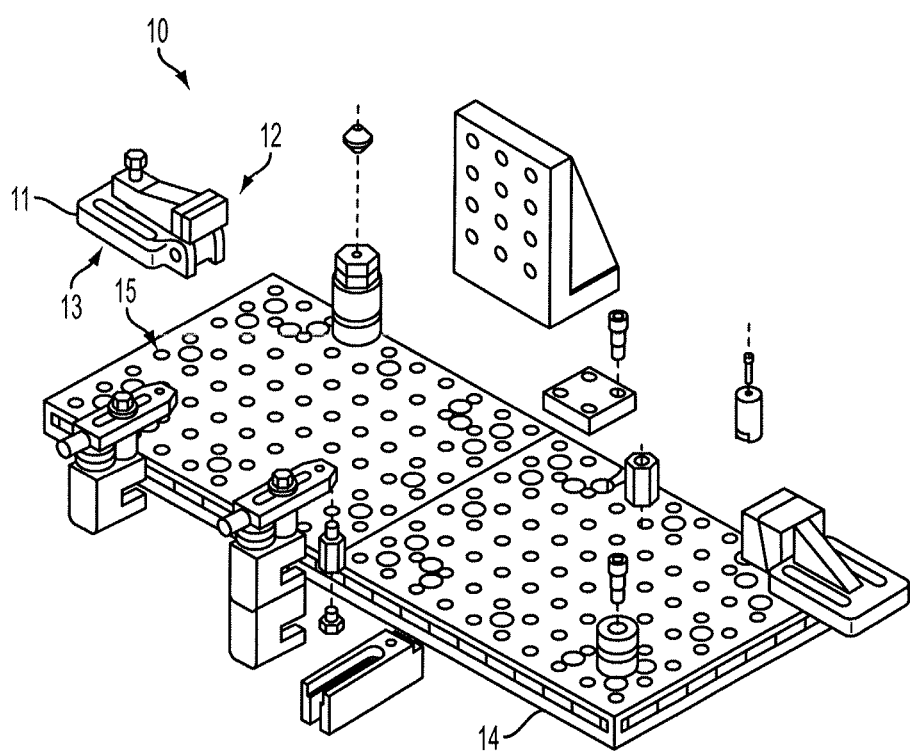
FIG. 1 is a diagram showing, by way of example, a prior art set of components of a modular fixture.
Figure 2:
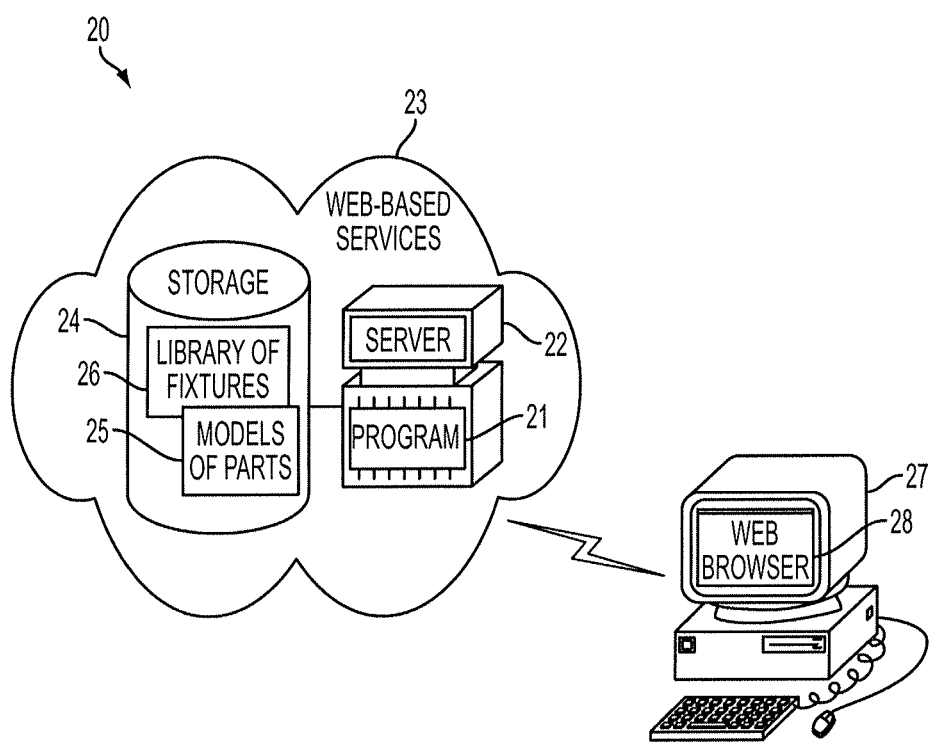
FIG. 2 is a functional block diagram showing a computer-implemented system for synthesizing a fixture layout for a part to be manufactured in accordance with one embodiment.

Computer-implemented geometrical methods for fixture planning and configuration are utilized to reason about the shape of a part to be manufactured and to check interference and collision constraints. The methods provide a set of accessible locations guaranteeing part immobility. FIG. 2 is a functional block diagram showing a computer-implemented system 20 for synthesizing a fixture layout for a part to be manufactured in accordance with one embodiment. The geometrical methods primarily focus on determining the location of fixture points, rather than accomplishing related analyses concerning deformation, tolerance, and so on.

In one embodiment, a Web-based service 23 provides detailed feedback on configurations of spatial locations of contact points on the boundary of a specified part and on fixture layouts of reconfigurable fixture elements, such as clamps. A program 21 is provided through a centralized server 22 that can be remotely accessed via the Web over a wide area public data communications network, such as the Internet, using wired or wireless connections. Users interface with the server 22 through a Web browser 28 executing on a personal computer 27 or similar device. The server 22 is operatively coupled to a storage device 24, within which is stored geometric models of designed parts 25, and a library of fixtures 26, which may be specific to a manufacturing facility. Both the server 22 and personal computer 27 include components conventionally found in general purpose programmable computing devices, such as a central processing unit, memory, input/output ports, network interfaces, and non-volatile storage, although other components are possible. In addition, other computational components are possible.

The program 21 implements a geometric engine that executes a set of spatial planning and analysis algorithms for automated spatial location determination and fixture matching. The models of parts 25 can include models for a part to be manufactured and constraint volumes for the part. Typically all locations on the boundary of a part will not be available for fixturing. In machining operations, for instance, material is removed from a larger shape, which could be raw stock or an intermediate staging model in a manufacturing process plan. As a result, one constraint in the fixturing problem is to locate the part without interfering with the tool's ability to remove the material as planned. Staging models and removal volumes can be computed for every tool orientation identified in a process plan, such as described in commonly-assigned U.S. Patent application, entitled "Computer-Implemented Method for Analyzing Machined Part Manufacturability and Performing Process Planning," Ser. No. 13/710,381, filed Dec. 10, 2012, pending, the disclosure of which is incorporated by reference, and stored in the storage device 24. The part model and the constraint volume include geometric representations of the part respectively defining the boundary of the part and a region defined about the boundary of the part. The constraint volume could also represent a removal volume that includes a geometric representation of material to be removed from the part as a result of machining by a cutting or milling manufacturing tool. The library of fixtures 26 can include a catalog of fixture elements, optionally specific to a manufacturing facility, and configurable to fixture the part during manufacturing. Other parts models and fixture content are possible.

Automated spatial location determination and fixture matching is performed by the program 21 in two distinct stages that can, in a further embodiment, be collaboratively executed as a single process. In the first stage, as further described infra with reference to FIGS. 8, 9 and 10, the spatial locations of clamping points on the part to be manufactured are determined to ensure immobility of the fixtured part under any infinitesimal perturbation. Fast algorithms generate fixture locations using the theory of form closure. A six-dimensional wrench space is partitioned to rapidly generate fixture locations that are close to optimal, qualitatively distinct, and which provide guaranteed stability through form closure. The partitioning relies on an indexing scheme that identifies subspaces corresponding to unique force-moment combinations and uses properties of the indexing system to provide form closure configurations, while dramatically reducing the search space of candidate solutions. The analysis distinguishes between fixtures that mostly resist external forces, and thus correspond to intuitive designs found in practice, and fixtures that resist both forces and moments, which provide better stability.

Figure 14:
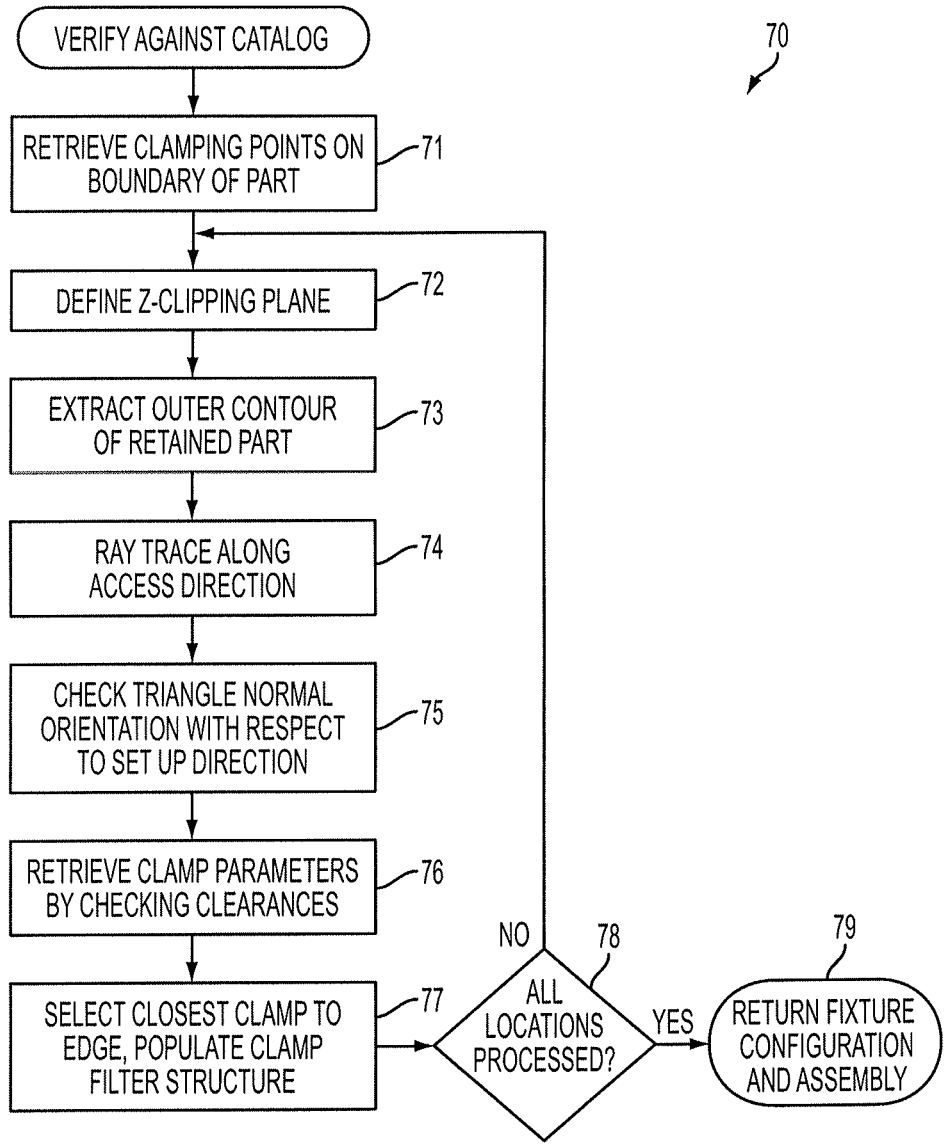
FIG. 14 is a flow diagram showing a function for locating clamping points against a catalog of fixtures for use in the method of FIG. 6.

In the second stage, as further described infra with reference to FIG. 14, spatial locations are matched against a user-specified library or catalog of reconfigurable clamps or fixture elements to synthesize a valid fixture layout or configuration that includes clamps that are accessible and collision free. The spatial locations matching during the second stage can be the same spatial locations chosen in the first stage to ensure immobility, or a different set of spatial locations. The spatial locations are connected to available clamps in the catalog and parameters for collision free clamps that are capable of reaching the given locations are generated. Collision analysis is performed for the chosen clamps until a valid and non-colliding set of clamps or fixture elements that match the spatial locations are found.

Figure 3:
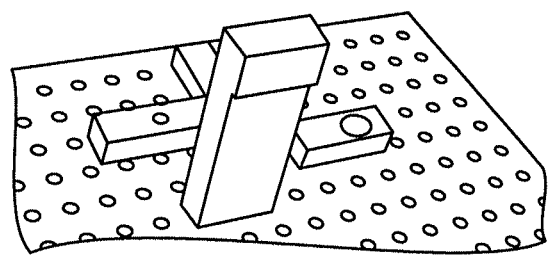
FIGS. 3-5 are diagrams showing, by way of example, three different fixture layouts generated using the system of FIG. 2.
Figure 4:
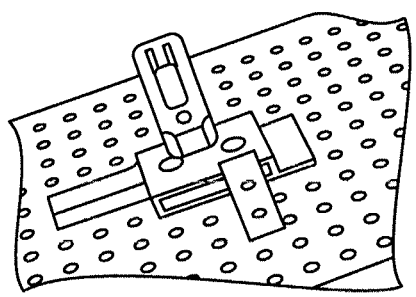
Figure 5:
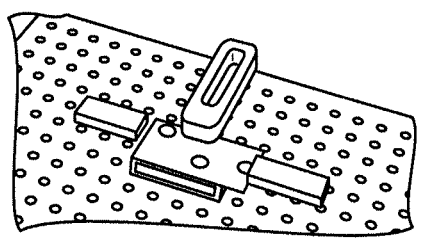

The automated spatial location determination and fixture matching methods performed by the program 21 are intended for integration into a larger automated process planning system. Thus, the program 21 provides checks to ensure that fixtures are not generated at spatial locations on the part that will interfere with tool motion during machining or other manufacturing operations, including inspection. The output of the system 20 is an automatically configured fixture layout that reflects the shop capability and guarantees part stability. FIGS. 3-5 are diagrams showing, by way of example, three different fixture layouts generated using the system 20 of FIG. 2. If no such fixture layout is possible, the part is classified by the system 20 as non-fixturable.

Conventional solutions for modular fixture synthesis are generally restricted to planar shapes that assumes that three locators and a clamp are sufficient to immobilize a shape. The assumption is valid for purely planar fixture synthesis where four fixture locations are provably necessary and sufficient to guarantee complete part immobility for two-dimensional degrees of freedom. Stability analysis to restrict planar motions relies on reasoning about a three-dimensional configuration space of forces and moments. For three dimensional motions, that is, six degrees of freedom, the problem requires stability analysis in six-dimensional space, which is computationally more challenging.

Due to the similarity between fixture planning and three-dimensional robotic grasp planning, algorithms for grasp planning are sometimes used in fixture planning to propose criteria for generating optimal stable fixtures that resist three-dimensional forces and torques. Such solutions are partial at best, even for purely geometric analysis for two reasons. First, the analysis typically stops at generating fixture locations and does not connect to a realistic modular fixture system, which is key to providing practical solutions. Furthermore, realistic solutions require post-processing of the generated locations to check for collision avoidance and repeated fixture synthesis may be necessary. Second, for the purposes of process planning, providing non-optimal, but qualitatively distinct solutions, can be more beneficial than providing a single optimized solution, which is generally more appropriate and necessary for compliant robot grasping. Fixture solutions that optimize a grasp metric may fail to pass other manufacturing process constraints, such as accessibility and collision avoidance, and the effort spent in optimizing grasping stability may not be warranted.

In three-dimensional fixture synthesis, six locators and at least one clamp are required for a grasp or fixture in the absence of friction. Candidate locations are chosen by sampling the surface of the part to be fixtured, which immediately creates a combinatorial problem; for n candidate locations, there are $$\binom{n}{7}$$

combinations of fixture locations and, therefore, exhaustive searches quickly become impracticable, which suggests the need to formulate fixture planning and synthesis as a constrained optimization problem. Where friction is present, three locators and at least one clamp are required for a grasp or fixture. Candidate locations are again chosen by sampling the surface of the part to be fixtured, which creates a similar combinatorial problem; for n candidate locations, there are $$\binom{n}{4}$$

combinations of fixture locations and the same need to formulate fixture planning and synthesis as a constrained optimization problem. The automated spatial location determination and fixture matching methods performed by the program 21 adopt a sampling strategy without optimization for the purposes of generating qualitatively distinct solution that dramatically reduces the search space, while also ensuring that the chosen configurations satisfy grasp conditions.

Figure 6:
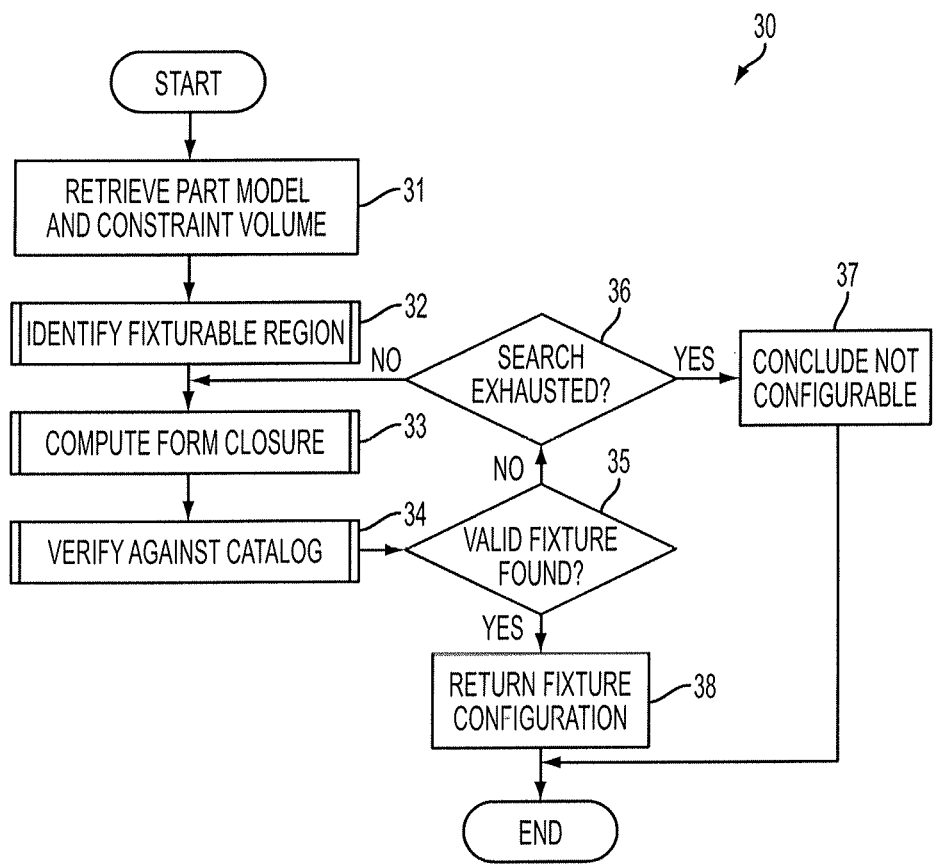
FIG. 6 is a flow diagram showing a computer-implemented method for synthesizing a fixture layout for a part to be manufactured in accordance with one embodiment.

Automated fixture selection and layout is solved in two stages using a generate and test strategy. FIG. 6 is a flow diagram showing a computer-implemented method 30 for analyzing machined part manufacturability and performing process planning in accordance with one embodiment. As an initial step, models 25 of the part to be manufactured and a constraint volume for the part are retrieved (step 31) from the storage device 24 (shown in FIG. 2). The part model can include a staging model that provides a volumetric representation of the part following machining or other manufacturing operation, or may simply represent the part as designed. The constraint volume can include a region defined about the boundary of the part, or may represent a removal volume that includes a geometric representation of material to be removed from the part, for example, as a result of machining by a cutting or milling manufacturing tool.

Figure 7:
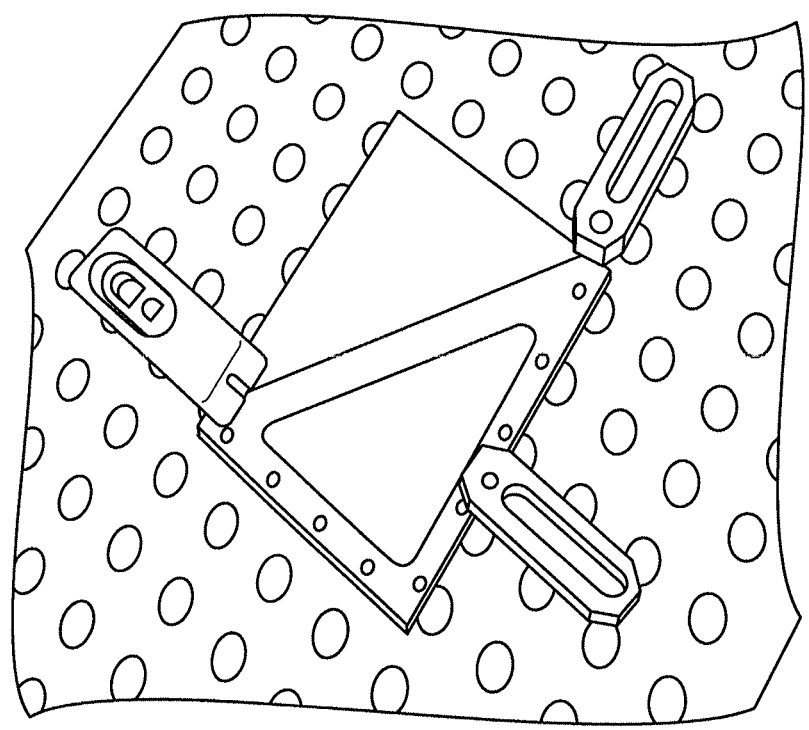
FIG. 7 is a block diagram showing, by way of example, a candidate fixture layout in which a possible tool collision can occur.
Figure 8:
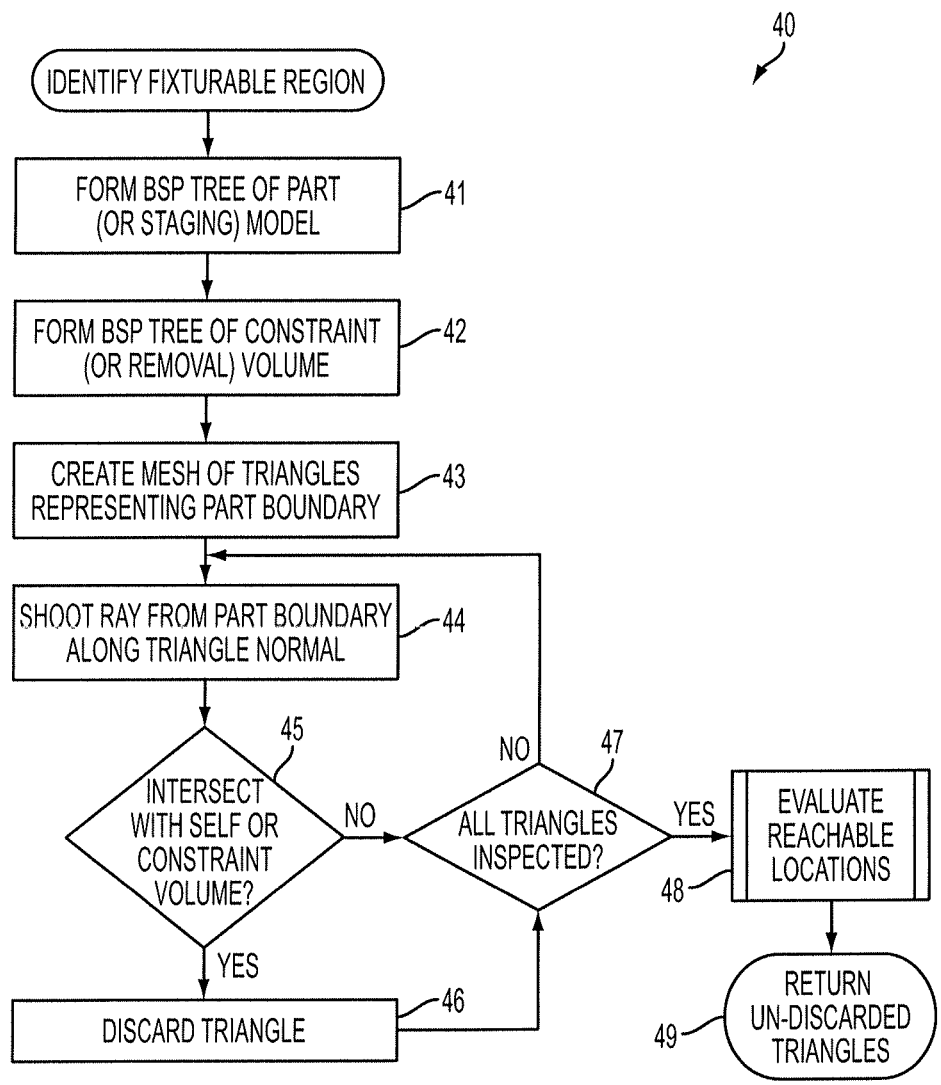
FIG. 8 is a flow diagram showing a function for identifying a fixturable region for use in the method of FIG. 6.
Figure 9:
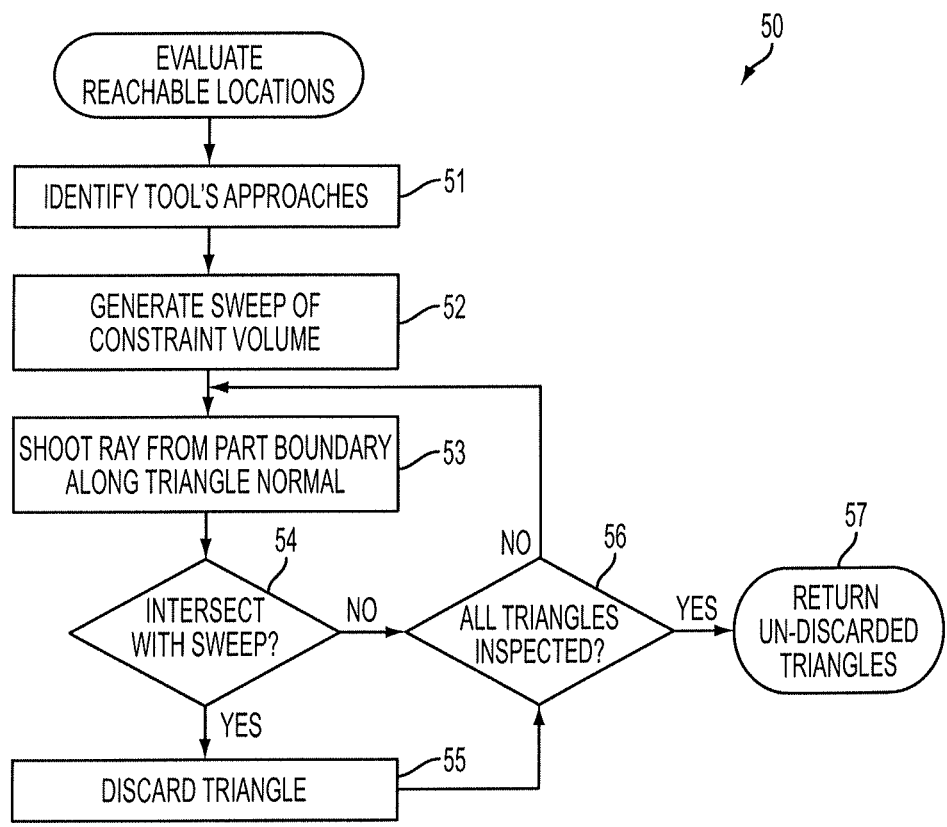
FIG. 9 is a flow diagram showing a function for evaluating reachable locations for use in the function of FIG. 7.
Figure 10:
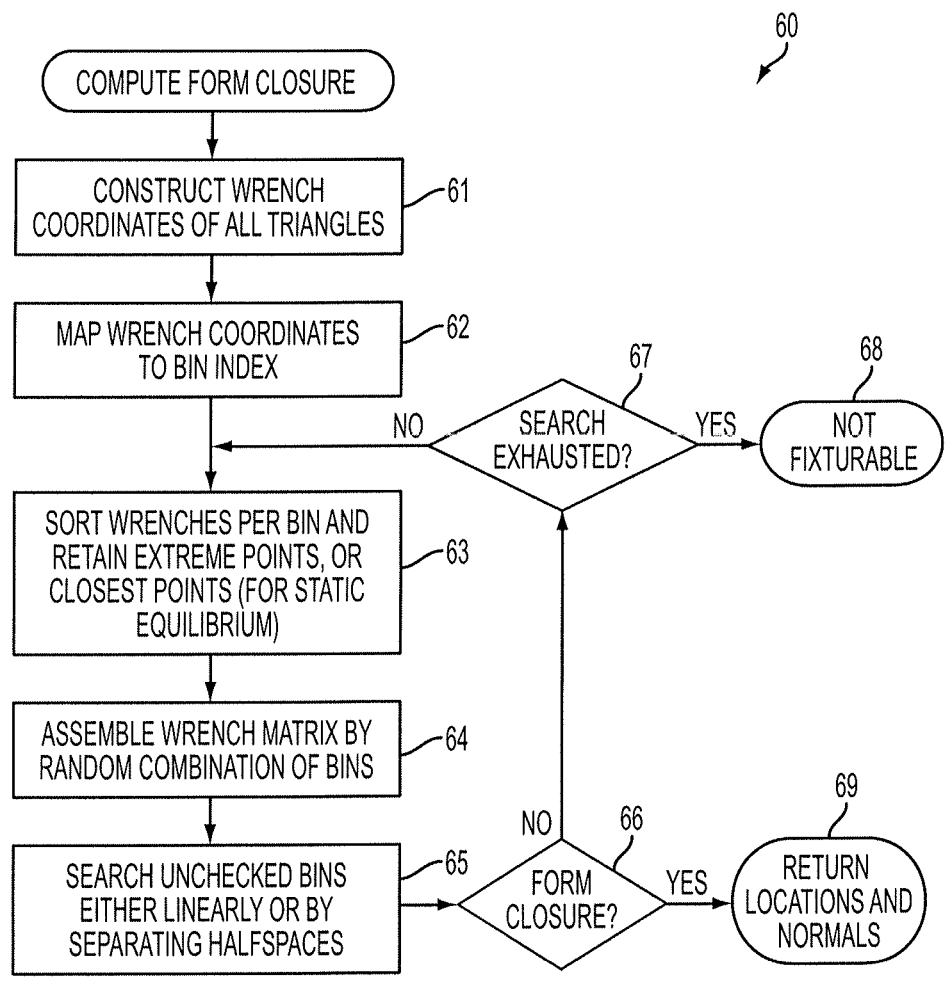
FIG. 10 is a flow diagram showing a function for computing form closure for use in the method of FIG. 6.

During the generate stage, locating clamping points that guarantee part immobility are generated by first identifying a fixturable region (step 32), as further described infra with reference to FIGS. 8 and 9, and then computing form closure over the identified fixturable region (step 33), as further described infra with reference to FIG. 10. During the test stage, locating clamping points, which could be the same points identified during the generate stage, are verified against a library or catalog of fixtures 26 (step 34), as further described infra with reference to FIG. 14, to determine if the points are accessible and locatable without collisions by any configuration of the available clamps. FIG. 7 is a diagram showing, by way of example, a candidate fixture layout in which a possible tool collision can occur. Referring back to FIG. 6, if such a fixture configuration is found (step 35), the configuration is identified and returned as a valid fixture (step 38), optionally along with the time and cost associated with the fixture. Otherwise, form closure computation (step 33) and catalog verification (step 34) are repeated, so long as the search space of candidate fixture configurations has not been exhausted (step 36). The part is concluded as not being fixturable (step 37) once no further candidate fixture configurations can be found (step 36).

The first stage, locating clamping points, will now be discussed in detail. Spatial locations of clamping points on the part to be manufactured are intended to ensure immobility of the clamped part under the application of any external force. The theories of force and form closure provide the mathematical basis for identifying such clamping locations, which are inherent to the geometry of the part and independent of the part's spatial position and orientation. In particular, under these theories, seven points are necessary and sufficient for frictionless grasping of a polyhedral part, while only four points are needed with frictional contact. The approach used here to determine locating points relies on a partitioning of six-dimensional wrench space sampled at coordinates of candidate fixture locations. Each region within the wrench space consists of (six-dimensional) vectors that represent a unique combination of forces and moments that may be exerted on the part. This partitioning scheme facilitates rapid identification of a set of locations whose combination guarantees part immobility and hence provide form closure. In particular, form closure is guaranteed by the requirement that the convex hull of the chosen Plücker vectors contains the origin of the wrench space.

Consider a polyhedral solid grasped at n contact locations. Assume that all contacts are point contacts and that line or surface contact can be approximated by two or more point contacts. Contact between the clamps and the surface may be modeled with or without friction. In the frictionless case, the clamp only exerts a force along the inward facet surface normal at the contact location. In the presence of friction, the clamp can exert both normal and tangential forces. Exerting a force f at any contact location on the polyhedral solid also generates a moment r×f about a vector r joining the point of contact and a reference point, typically the center of mass of the polyhedral solid. Each force-moment combination is called a wrench and is represented by six-dimensional wrench coordinates (f, r×f). The center of mass can also serve as the origin of the six-dimensional wrench space, isomorphic to $\Re^6$.

The mobility of a rigid body may be partially or completely constrained by a finite set of wrenches derived from locations on the boundary of the body. When the set of locations restrict the body to remain immobile under the application of any external wrench, the body is said to be inform closure. In the event the set of locations can only restrain a bounded set of external wrenches, the body is said to be in force closure. Five key properties of bodies in form closure are used herein:

(1) A solid admits a form closure grasp if and only if a linear combination of wrenches applied at a finite set of locations is capable of resisting arbitrary external wrenches, that is, there exists a set $\{w_i\}$ of wrenches, such that for positive $\lambda_i$, $\Sigma\lambda_i w_i = -w_{ext}$ exists for any external wrench $w_{ext}$. In other words, the $w_i$ must constitute a positive span of $\Re^6$. In practice, increasing or decreasing any $\lambda_i$ to balance an external wrench corresponds to tightening or loosening the clamp at location i.

(2) A positive span of $\Re^n$ is guaranteed by a set of vectors if and only if the convex hull of the vectors contains the origin. This property immediately establishes a test of fixturability, whereby a solid is fixturable if and only if the convex hull of all candidate wrenches contains the origin.

(3) n+1 vectors are both necessary and sufficient to positively span $\Re^n$. Therefore, seven points are necessary and sufficient to ensure frictionless form closure. Note that this property helps explains why the $\lambda_i$ must be strictly positive. A positive span cannot be accomplished if one or more of the seven wrenches vanishes, that is, if the corresponding $\lambda_i=0$, and negative $\lambda_i$ are not permissible since they correspond to (pulling) forces applied along the outward surface normal.

(4) Defining a 6×7 wrench matrix W, whose columns are the $w_i$ in the grasp, testing form closure via containment of the origin within the convex hull of the wrenches is equivalent to asserting that the nullspace of W has purely positive coefficients. When the nullspace vector v has purely positive coefficients, the nullspace vector v may be scaled by its $L^1$ norm to yield the vector $$u = \frac{v}{\|v\|_1},$$

which is also an element of the nullspace of W. The components of u are the $\lambda_i$, from which can be checked that $\Sigma\lambda_i=1$ implying the origin is expressed as a convex combination of the $w_i$ and is therefore contained in the convex hull of the wrenches.

(5) In the case of frictional contact, tangential forces due to gravity or by external application are resisted by virtue of friction. The magnitude of the resistance is directly proportional to the coefficient of friction, and frictional forces map to wrenches. Four points can be shown as sufficient to generate seven wrenches, whose convex hull contains the origin. However, since the friction wrenches cannot be physically scaled by arbitrary $\lambda_i$, the grasped configuration corresponds to a force closure.

During the first part of the generate stage, fixturable regions on the boundary of the part are identified. FIG. 8 is a flow diagram showing a function 40 for identifying a fixturable region for use in the method 30 of FIG. 6. Given a model of the part, which can include a staging model, and a constraint volume, which can include a removal volume, the locations on the part boundary that cannot be approached by a moving tool or a clamp are identified. These locations correspond to the surfaces exposed, for instance, after a machining process step has been completed.

To discard the exposed surfaces of the part, binary space partitioning (BSP) trees of the part (or staging) model and the constraint (or removal) volume are respectively formed (steps 41 and 42). The set of candidate fixturable locations on the boundary of the part is obtained by sampling the part boundary, for example, by considering centroids of triangles in a mesh representing the part boundary (step 43). BSP trees are optimized for ray intersection calculations and fast querying of whether a ray shot from a location on the part boundary along the triangle (location) normal will intersect the part model (step 44). If the ray indicates an intersection between the ray and the constraint volume, or between two or more rays (step 45), the triangle (location) is discarded (step 46). This computation is an abstraction for indicating whether the location on the part boundary is reachable by a clamp or fixture element without collision with a volume constrained or to be removed by a manufacturing tool. Ray shooting (step 44) and intersection testing (step 45) continues until all of the triangles (locations) have been inspected (step 47), after which the set of reachable triangles (locations) is evaluated to determine whether the clamp or fixture element will interfere with the tool (step 48), as further described infra with reference to FIG. 9. Upon completion of the evaluation (step 48), all remaining un-discarded triangles (locations) are returned as the set of candidate fixturable locations (step 48).

Collisions with the tool are also evaluated using a form of ray intersection test. FIG. 9 is a flow diagram showing a function 50 for evaluating reachable locations for use in the function 40 of FIG. 7. The tool's approaches to the part are identified (step 51), such as by evaluating the manufacturing process plan. The tool's approaches could include the directions of approach as influenced by set up. A sweep of the constraint (or removal) volume in each approach is generated (step 52) and a ray is shot from a location on the part boundary along the triangle (location) normal (step 53). If the ray indicates an intersection between the ray and the sweep (step 54), the triangle (location) is discarded (step 55). This computation is an abstraction for indicating whether a clamp or fixture element contacting the location on the part boundary would collide with a manufacturing tool. Ray shooting (step 53) and intersection testing (step 54) continues until all of the triangles (locations) have been inspected (step 56), after which all un-discarded triangles (locations) are returned as the set of candidate fixturable locations that are collision free (step 57).

During the second part of the generate stage, form closure of the part is computed. FIG. 10 is a flow diagram showing a function 60 for computing form closure for use in the method 30 of FIG. 6. Let $p_i$ and $n_i$ be vectors that denote the position and unit inward surface normal at sampled locations indexed by i. The center of mass serves as the origin for a global coordinate system that represents a wrench coordinate system, although other points could serve as the origin. Assuming point contact, a clamp at location i exerts a force $f_i$ along $n_i$. In the presence of friction, assuming a Coulomb model and a coefficient of friction µ, a non-slipping tangential force $f_{ij}$ along a tangent direction j at location i satisfies the expression:

$$\|f_{ij}\| \leq \|\mu f_i\| \qquad (1)$$

Therefore, the net non-slipping force acting at any point contact location is:

$$\sum_j (f_{ij} + f_i) \qquad (2)$$

The limit points of the set of non-slipping tangent forces lie on a circle of radius $\|\mu f_i\|$ and the set $f_{ij}+f_i$ of resultant vectors form a cone that is called the Coulomb friction cone. For computational purposes, tangent forces are sampled at discrete orientations on a circle that, in turn, represents the friction cone as a polyhedron. When the sampled orientations constitute a set $S=\{\theta, \pi+\theta \in S\}$ (for example, when the angles are sampled in increments of $$\frac{\pi}{360}),$$

the tangent forces at angles $\theta$ and $\pi+\theta$ are equal and opposite and will sum to zero. Therefore, the maximum possible non-slipping force at any contact location is $\hat{f}_i = \Sigma_j f_i$. Form closure calculated with this maximal frictional force will correspond to a convex hull with larger convex span than a hull obtained without considering friction, thus implying frictional form closure requires less compliant control to resist external wrenches.

Each applied force $\hat{f}_i$ is mapped to a wrench by their triangle (location) defined by the Plücker coordinates $w_i = (\hat{f}_i, p_i \times \hat{f}_i)$ (step 61). The space of all possible wrenches is isomorphic to $\mathfrak{R}^6$, which allows use of the canonical basis of Euclidean space to define orthants (generalizations of quadrants and octants corresponding to sectors in a coordinate system) or bins into which sampled Plücker coordinates are hashed. Each bin is the space formed by the intersection of six mutually-orthogonal halfspaces, yielding a total of $2^6=64$ unique bins. The hash function used to map sampled wrenches into bin indices (step 62) is a composition of three simple functions:

(1) The wrench step function v: $\mathfrak{R}^6 \to \mathfrak{R}^6$ obtained by applying the Heaviside step function to each component $w_k$ of a wrench, such that:

$$v(w_i)=\{\text{Heaviside}(w_1), \text{Heaviside}(w_2), \ldots, \text{Heaviside}(w_6)\}$$

(2) A concatenation of the components of $v(w_i)$ into a six-bit binary string.

(3) A binary-to-decimal conversion of the constructed six-bit binary string to identify the bin into which the wrench was hashed.

Thus, by way of example, a force (1,−1,1) applied at (2,3,5) produces a wrench (1,−1,1,8,3,−5) whose step function (1,0,1,1,1,0) is mapped to the string 101110 whose decimal representation is (the bin index). Once the sampled wrenches are hashed into appropriate bins, vectors in each bin are sorted according to their $L^2$ norm and the furthest points in each bin are retained as extreme points (step 63).

In a further embodiment, as described infra, the points closest to the origin are retained as the extreme points for static equilibrium.

Form closure is possible if and only if there exists a combination of seven extreme points whose convex hull contains the origin. A solution can be found by computing the convex hull of all extreme points, for example, using Qhull, such as described in C. B. Barber et al., "Qhull," (1995) (/www.geom.umn.edu/software/qhull), operated by the University of Minnesota, Minneapolis, Minn. University of Minnesota, the disclosure of which is incorporated by reference, and testing whether the origin is contained within the convex hull using an iterative method. Other origin containment tests are possible, including two heuristic tests described infra.

Note that in the worst case, there are at most 64 extreme points among all non-empty bins by virtue of the indexing scheme, and the convex hull has $O(n^3)$ time complexity. Even with this dramatic reduction of points, if the convex hull of the extreme points contains the origin, there are still $$\binom{64}{7}$$

combinations of candidate form closure points configurations. When favoring qualitatively distinct solutions over optimal solutions, two heuristical algorithms to quickly produce qualitatively distinct form closure configurations could be used:

(1) Randomized algorithm. The randomized algorithm chooses six extreme points at random (step 64) and tests for linear independence of the corresponding vectors by constructing a wrench matrix whose columns are the vectors corresponding to the extreme points. If the wrench matrix is non-singular, then the remaining bins, that is, the bins exclusive of those bins from which the extreme points were randomly selected, which is at most 57 bins, are iteratively searched (step 65) to check whether a form closure configuration exists (step 66). Form closure of the potential configuration can be established upon implicit inclusion of the origin within the convex hull. If form closure exists (step 66), the algorithm terminates by returning the locations and the normals (step 69). Otherwise (step 66), processing (steps 63-65) and testing (step 66) continues until the search space has been exhausted (step 67). An exhausted search space (step 67) signifies that the part is not fixturable (step 68). In a further embodiment, qualitatively distinct solutions can be generated by choosing different seeds for the random number generator.

(2) Separating halfspaces algorithm. The convex hull $Hull_e$ of extreme points can be asserted to have elements on either side of any hyperplane passing through the origin if the convex hull $Hull_w$ of wrench points has the property of form closure. To show this property, note that every hyperplane H passing through the origin separates $\Re^6$ into disjoint halfspaces $H_+$ and $H_-$ defined by the hyperplane. In particular, this observation is true for every principal hyperplane $x_i=0$. If the origin is inside the hull, then $(H_+ \cap Hull_w) \cup (H_- \cap Hull_w)$ represents a positive span of $\Re^6$. However, neither $(H_+ \cap Hull_w)$ nor $(H_- \cap Hull_w)$ represent a positive span of $\Re^6$, therefore points on $Hull_w$ must lie on either side of H. Without losing generality, assume that $(H_- \cap Hull_e) = \emptyset$; if true, then a situation where $Hull_w$ contains the origin but $Hull_e$ does not exists. In other words, there are no extreme points in $H_-$ that belong to $Hull_w$. However, if a point p in $H_-$ is a member of $Hull_w$, the bin containing p has an extreme point that is p or some other point q. Note that this situation does not imply that $Hull_e$ contains the origin for which simple counter examples can be found in two dimensions.

By virtue of the bin indexing scheme, the indices corresponding to bins on $H_+$ and $H_-$ can be generated when H is one of the six principal hyperplanes. Assuming the bin indices are numbered 0, . . . , 63, the indices 0, . . . , 31 and 32, . . . , 63 lie on either side of one of the principal hyperplanes. Five successive transformations of $2^k \% 63$ for each bin k in the initial partition gives bin indices on either side of the five other principal hyperplanes. Thus, if the wrench matrix is generated using bins on one half of a separating hyperplane (halfspace) (step 65), the final form closure location can be found (step 66) among the (at most) 32 other bins on the other half of the hyperplane.

The two foregoing algorithms allow rapid generation of form closure configurations of locations on a polyhedral solid. The key insight is that the partitioning of wrench points into bins dramatically reduces the problem size to at most 64 candidate locations, which can be quickly searched to generate form closure locations. In the case of frictional form closure, picking three bins whose extreme points, along with corresponding wrenches mapped from the tangent space of frictional forces, is sufficient form a linearly independent basis. Seven point form closure algorithms may be applied to generate form closure locations.

Figure 11:
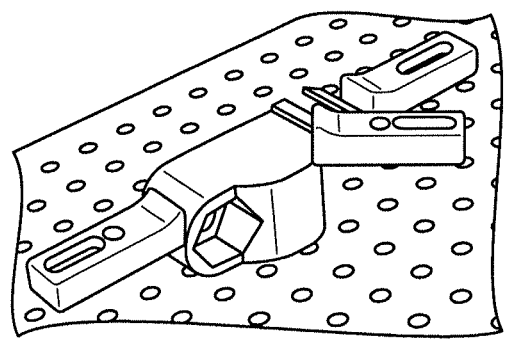
FIG. 11 is a diagram showing, by way of example, a clamp solution for frictional form closure mimicking a vise configuration.
Figure 12:
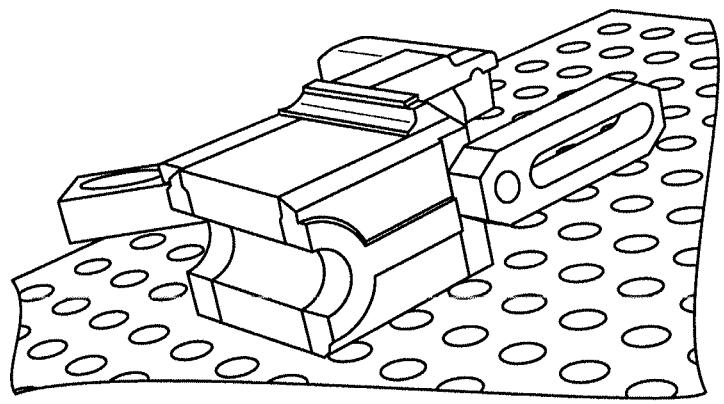
FIG. 12 is a diagram showing, by way of example, a side clamp solution used when surfaces perpendicular to the machined volume are available for fixturing.
Figure 13:
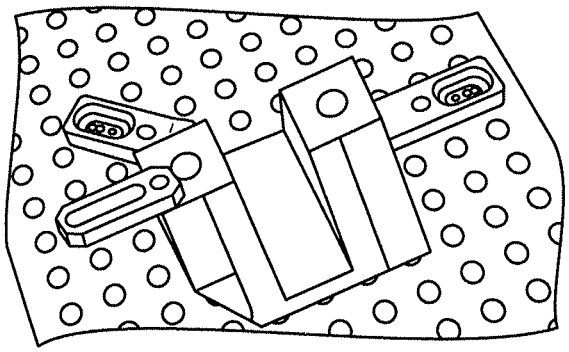
FIG. 13 is a diagram showing, by way of example, how strap clamps are used when surfaces along the tool approach direction are available with sufficient clearance.

Often, the locations produced by form closure configurations obtained by combining extreme points do not necessarily correspond to intuitive designs adopted by human designers. Extreme points have the nice property that their convex hull balances a large set of external forces and moments without tightening clamps. As opposed to picking extreme points, when picking points closest to the origin, the resulting configurations are visually more appealing to human designers. For instance, FIG. 11 is a diagram showing, by way of example, a clamp solution for frictional form closure mimicking a vise configuration. FIG. 12 is a diagram showing, by way of example, a side clamp solution used when surfaces perpendicular to the machined volume are available for fixturing. Finally, FIG. 13 is a diagram showing, by way of example, how strap clamps are used when surfaces along the tool approach direction are available with sufficient clearance. When points closest to the origin in each bin are chosen, the implied moment components of the Plücker coordinates of these points are minimal compared to all other points in the bin because, by construction, the force applied at each triangle has the same magnitude. Since moments are defined about a line of action in three-dimensional space, the least moment (a zero moment) occurs when the vector joining the action point and center of mass is along (and not just parallel to) the direction of the applied force. This occurrence implies that the closest Plücker coordinate in each bin is a pure force (or something close to a pure force).

When a form closure configuration is found for such points, the configuration corresponds to fixtures that human designers would design because they tend to solve fixturing as a static equilibrium (or force balancing) problem. By choosing the center of mass as the reference point, these "minimal moment" action points will tend to be defined on planar facets whose normals are along the vector joining their centroid with the center of mass. Such points will be visually appealing to human designers because they will be automatically located at centers of faces of the solid model.

During the test stage, fixtures are selected by locating clamping points from a library or catalog. FIG. 14 is a flow diagram showing a function for locating clamping points against a catalog of fixtures for use in the method 30 of FIG. 6. Given a set of clamping point locations on the boundary of a part (step 71), which could be the form closure clamping locations identified during the generate stage, described supra, the problem of fixture matching involves selecting candidate clamps from a given library of parts. The fixtures are assumed to be modular. In a further embodiment, the fixtures are selected to minimize the number of different fixture elements needed to satisfy clamping conditions for a sequence of process steps through which the part is to be manufactured. In a still further embodiment, the fixtures are also selected to cause minimal disruption to existing tooling, such that a minimal number of changes to fixture elements need occur between each consecutive process step.

Skipping ahead, the input set of locating points on the boundary of the part is vetted against the library of fixtures to generate parameters for clamps that are accessible in light of fixture element and constraint (or removal) volume clearances and which pass the collision tests with the part and surrounding tooling (step 76). The parameters are matched against the library to retrieve a set of clamps (step 77), if they exist and preferably closest to the edge, and assemble (and return) a clamp filter structure for a fixture configuration to guarantee stability (step 79). If there is no such solution, the algorithm is repeated until all form closure configurations of clamps in the catalog (step 78) are exhausted.

The test phase employed to fixture generation identifies fixture components that are collision free both mutually and with respect to the part. Form closure points, such as identified in the generation phase, as described supra, are translated into a set of locators, clamps, and other associated fixture element components, and assembled on the base plate. This process requires creating a representation for modeling the fixture catalog and transforming the form closure points into a filter that can be applied to the fixture catalog. Setting up the filter requires identification of fixture element type, extents of the clamp, position of the clamp or locator at the specified point, and avoiding any intersections among themselves or support elements.

The representation of the fixture element catalog and algorithm for creating the clamp filter data will now be discussed in detail. Fixture catalogs available online, such as Fixtureworks or Carr Lane, cited supra, have devised a fixture ontology for efficiently searching through modular fixture elements in a user-driven query and filter format. The catalog representation applicable herein provides information on the bounding box of the reachable workspace of the clamps, availability of components, compatibility with base fixtures, and clamping forces, which can be expressed in a JSON or other similar format.

The local neighborhood of a form closure point (or, more generally, a point on the boundary of a part) needs to be categorized to describe a collision free region around a form closure point. The local neighborhood is categorized by describing a clamp-type independent coordinate system at the form closure point. This local coordinate system is defined by basis vectors representing access direction, thickness and width. The thickness and width of individual clamps are as defined in the catalog. Ray tracing is used to determine collision free distance along the thickness and width basis vectors. Access direction clearance is determined only in the positive direction and needs to be collision free. The sum of collision free distances along each basis vector provides the upper bound for the thickness and width of the fixture element, although any of the fixture element's dimensions could be used in determining whether the element exceeds part clearance, as described supra, and to identify a fixture element that is suitable at the form closure point.

Parts are typically loaded and unloaded from the fixture in a set up direction. A part envelope is defined as the sweep of the part along the set up direction, although other geometric representations of access constraints are possible. Clamps (or fixture elements) need to be interference free with respect to the part envelope to provide collision free access. The distance that a clamp needs to translate along the access direction to avoid interference with the part envelope from its clamped position is referred to as part clearance. The calculation of this distance is accomplished by a three-step process:

(1) Trim the model of the part with a z-clipping plane defined by the form closure point (or boundary point) and the set up vector and retain the solid below the z-clipping plane (step 72).

(2) Extract an outer contour of the retained part projected onto the base plane (step 73). Extraction can be accomplished rapidly using image processing techniques, which render the part along the set up direction and edge detection.

(3) Perform ray tracing along access direction to identify clearance distance (step 74).

The computed clearance distance is used to further filter the catalog for usable clamps (or fixture elements). During the search of the catalog, a feasible base plate is first selected based on a bounding box of the part. A clamp filter used to identify feasible clamps in the catalog. The clamp filter contains the following criteria information for each form closure point (or boundary point): maximum width, maximum thickness, and part clearance. In a further embodiment, additional criteria could be applied, including availability, smallest size and lowest forces.

The selected fixture needs to be free of collisions with the tool motion. Removal (or constraint) volume is swept along the set up direction to define the tool collision avoidance region. Fixtures are then checked for interference against this region is applied by checking triangle (point) normal orientation with respect to the set up direction (step 75).

The form closure computations, as described supra, are based on the assumption that there is a point contact between clamp (or fixture element) and the part. The clamp face defined in the catalog can translate on the plane defined by the form closure point (or boundary point) and the access direction while containing the form closure point. This translation allows alignment of holes (or mounting feature) in the clamp to the holes (or attachment points) defined in the base plate.

To positioning the clamp face on the part, a homogenous transformation is computed between the part and the base fixture to align them for assembly. A plane is defined at the contact point with basis vectors X and Y defined by the hole (attachment point) configuration on the base plate. Without loss of generality, let the x-axis be the access vector of a clamp and s be the spacing of holes in the base plate. The part needs to be shifted along y-axis by an offset to align clamp with modular hole. To auto-align holes, the width of the clamp, as defined by the catalog, is greater than the spacing s and the clearance along either side of the width vector is greater than half the spacing s. Let (x,y) be the position of the form closure point projected onto the base plate. The center of the clamp face projected onto the base is aligned by an offset position expressed by:

If $(y \mod s) > \left(\frac{s}{2}\right)$, then offset = $s - (y \mod s)$ else offset = $-(y \mod s)$ This offset is the transformation applied to the clamp face to maintain contact with the form closure point previously computed (or boundary point) and to be aligned to a hole (or attachment point) in the base plate.

Clamp assemblies can overlap, even though form closure points are separated by the specified distance. Clamp position overlap is checked by projection of the clamp outlines onto the base plane and performing interference checks in two dimensions. Once a set of collision free clamps and locators (or other fixture elements) are identified, to position the objects for visualization, the local coordinate system on the STL files of the clamp are mapped to the local coordinate system defined for form closure points.

To summarize, automatic fixture configuration through multiple setups for realistic three-dimensional parts and process planning with fixture elements from a vendor- or user-supplied catalog has not been effectively addressed. The foregoing two-stage approach solves several sub-problems attendant to this need:

- Determining non-fixturable regions of the part as dictated by process specific constraints, such as tool movement and accessibility.
- Determining locating points on the surface of the solid model at fixturable locations by partitioning six-dimensional wrench space sampled at wrench coordinates of candidate fixture locations.
- Providing solutions for both form closure (more stable designs) and static equilibrium (more common designs).
- Identifying physical clamps from a vendor- or user-supplied catalog by performing fast collision checks that determine parameters for usable clamps at each location on the part's boundary.
- Facilitating reusability of clamps in multiple formats.
- Using the same set of clamps for a part operated on in multiple orientations by efficiently searching the space of all possible clamp configurations guaranteeing form closure.
- Providing rapid reconfiguration of a static set of clamps to accommodate multiple setups and orientations, with minimal disruption to existing tooling.
- Incorporating fixture synthesis, validation, and planning in automated process planning for machining.

While the invention has been particularly shown and described as referenced to the embodiments thereof, those skilled in the art will understand that the foregoing and other changes in form and detail may be made therein without departing from the spirit and scope of the invention.

What is claimed is:

1. A system for fixture configuration determination for part manufacturing with the aid of a digital computer, comprising:
a storage of digital information comprising:
a model of a part to be manufactured and a constraint volume; and
a catalog of multiplicity of fixture elements specific to a manufacturing facility and configurable to fixture the part;
a computer comprising a processor and memory operatively coupled to the storage, comprising:
an identification module that identifies fixturable regions comprising locations on the part's surfaces that cannot be approached by either a tool in motion used during manufacturing of the part or a clamp;
a clamp module that specifies that a clamp located at each of a plurality of reachable locations exerts a known force along a vector from a unit inward surface normal at the reachable locations, wherein the clamp at reachable location i exerts a force fi along ni,
where pi and ni comprise vectors that denote a position and the unit inward surface normal at the reachable locations indexed by I, such that, in the presence of friction, assuming a Coulomb model and a coefficient of friction $\mu$, a non-slipping tangential force fij along a tangent direction j at location i satisfies the expression:

$$\|f_{ij}\| < \|\mu f_i\|$$

and a net non-slipping force acting at any point contact location is;

$$\sum_j (f_{ij} + f_i),$$

wherein limit points of a set of non-slipping tangent forces lie on a circle of radius $\|\mu f_i\|$ and a set fij+fi of resultant vectors form a cone that is called the Coulomb friction cone;
an immobilization module that identifies fixturing points for immobilization of the part by computing form closure over the fixturable regions;
a selection module that uses the fixturing points and the constraint volume to select a plurality of the fixture elements for a fixture configuration that ensures stability of the part; and
the tool manufactures the part following a determination of the fixture configuration that ensures the stability of the part.

2. A system according to claim 1, further comprising:
a sampling module configured to sample locations on a boundary of the part as candidate fixturable locations;
determining whether a ray shot from each of the sampled location on the part boundary will intersect the part model;
determining whether the ray shot from each of the sampled location on the part boundary will intersect another one of the rays;
discarding those of the sampled locations associated with rays intersecting the part model or another one of the rays as the candidate fixturable locations.

3. A system according to claim 2, further comprising:
representing the boundary as a mesh comprised of a plurality of triangles,
wherein each of the locations is within one of the triangles.

4. A system according to claim 3, wherein each ray is shot along a normal of one of the triangles.

5. A system according to claim 2, further comprising:
evaluating those of the sampled locations that have not been discarded to determine if the clamp at that sampled location will interfere with the tool;
discarding those of the sampled locations at which the clamp will interfere with the tool, wherein the fixturable regions are determined using the sampled locations that have not been discarded.

6. A system according to claim 1, wherein the fixture elements are selected to minimize the number of the fixture elements.

7. A system according to claim 1, wherein the part is manufactured through a manufacturing process comprising a plurality of manufacturing process steps and wherein the fixture elements are selected to minimize a number of changes to the fixture elements between the different process steps.

8. A system according to claim 1, wherein, further comprising:
generating fixture element parameters based on the fixturing points and the constraint volume;
matching the parameters against the catalog to select the plurality of fixture elements.

9. A system according to claim 8, wherein the parameters are further generated based on a part clearance associated with each of the fixture elements, the part clearance comprising a distance that the fixture element needs to translate along an access direction to avoid interference with an envelope of the part.

10. A system according to claim 9, further comprising:
trimming the model of the part with a plane defined at each of the fixturing locations and a set up vector and retaining a solid rendering of the part taken from below the plane;
extracting an outer contour of the solid rendering of the part projected onto a plane defined on the surface of the base plate; and
determining the part clearance through ray tracing from the outer contour along the access direction.

11. A method for fixture configuration determination for part manufacturing with the aid of a digital computer, comprising:
maintaining in a database a model of a part to be manufactured and a constraint volume; and
maintaining in a database a catalog of multiplicity of fixture elements specific to a manufacturing facility and configurable to fixture the part;
identifying by a computer, the computer comprising a processor and coupled to the database, fixturable regions comprising locations on the part's surfaces that cannot be approached by either a tool in motion used during manufacturing of the part or a clamp;
specifying with the computer that a clamp located at each of a plurality of reachable locations exerts a known force along a vector from a unit inward surface normal at the reachable location, wherein the clamp at reachable location i exerts a force $f_i$ along $n_i$, where $p_i$ and $n_i$ comprise vectors that denote a position and unit inward surface normal at the reachable locations indexed by I, such that, in the presence of friction, assuming a Coulomb model and a coefficient of friction $\mu$, a non-slipping tangential force $f_{ij}$ along a tangent direction j at location i satisfies the expression:

$$\|f_{ij}\| < \|\mu f_i\|$$

and a net non-slipping force acting at any point contact location is:

$$\sum_j (f_{ij} + f_i)$$

wherein limit points of a set of non-slipping tangent forces lie on a circle of radius $\|\mu f_i\|$ and a set $f_{ij}+f_i$ of resultant vectors form a cone that is called the Coulomb friction cone;
identifying by the computer fixturing points for immobilization of the part by computing form closure over the fixturable regions;
using the fixturing points and the constraint volume to select a plurality of the fixture elements for a fixture configuration that ensures stability of the part; and
using the tool to manufacture the part following a determination of the fixture configuration that ensures the stability of the part.

12. A method according to claim 11, further comprising:
sampling locations on a boundary of the part as candidate fixturable locations;
determining whether a ray shot from each of the sampled location on the part boundary will intersect the part model;
determining whether the ray shot from each of the sampled location on the part boundary will intersect another one of the rays;
discarding those of the sampled locations associated with rays intersecting the part model or another one of the rays as the candidate fixturable locations.

13. A method according to claim 12, further comprising:
representing the boundary as a mesh comprised of a plurality of triangles,
wherein each of the locations is within one of the triangles.

14. A method according to claim 13, wherein each ray is shot along a normal of one of the triangles.

15. A method according to claim 12, further comprising:
evaluating those of the sampled locations that have not been discarded to determine if the clamp at that sampled location will interfere with the tool;
discarding those of the sampled locations at which the clamp will interfere with the tool,
wherein the fixturable regions are determined using the sampled locations that have not been discarded.

16. A method according to claim 11, wherein the fixture elements are selected to minimize the number of the fixture elements.

17. A method according to claim 11, wherein the part is manufactured through a manufacturing process comprising a plurality of manufacturing process steps and wherein the fixture elements are selected to minimize a number of changes to the fixture elements between the different process steps.

18. A method according to claim 11, wherein, further comprising:
generating fixture element parameters based on the fixturing points and the constraint volume;
matching the parameters against the catalog to select the plurality of fixture elements.

19. A method according to claim 18, wherein the parameters are further generated based on a part clearance associated with each of the fixture elements, the part clearance comprising a distance that the fixture element needs to translate along an access direction to avoid interference with an envelope of the part.

20. A method according to claim 19, further comprising:
trimming the model of the part with a plane defined at each of the fixturing locations and a set up vector and retaining a solid rendering of the part taken from below the plane;

extracting an outer contour of the solid rendering of the part projected onto a plane defined on the surface of the base plate; and determining the part clearance through ray tracing from the outer contour along the access direction.

* * * * *